(12) United States Patent
James et al.

(10) Patent No.: US 9,673,394 B2
(45) Date of Patent: *Jun. 6, 2017

(54) CONDUCTING FORMULATION

(75) Inventors: Mark James, Romsey (GB); Iain McCulloch, Southampton (GB); Warren Duffy, Southampton (GB); Philip Edward May, Sidcup (GB); Dan Walker, Southampton (GB); David P. Waller, Lexington, MA (US); Richard Kendall Childers, Dracut, MA (US); Sheila E. Rodman, Malden, MA (US)

(73) Assignee: MERCK PATENT GMBH, Darmstadt (DE)

( * ) Notice: Subject to any disclaimer, the term of this patent is extended or adjusted under 35 U.S.C. 154(b) by 902 days.

This patent is subject to a terminal disclaimer.

(21) Appl. No.: 12/738,471

(22) PCT Filed: Sep. 19, 2008

(86) PCT No.: PCT/EP2008/007896
§ 371 (c)(1),
(2), (4) Date: Apr. 16, 2010

(87) PCT Pub. No.: WO2009/049744
PCT Pub. Date: Apr. 23, 2009

(65) Prior Publication Data
US 2010/0213455 A1 Aug. 26, 2010

(30) Foreign Application Priority Data

Oct. 18, 2007 (EP) ..................................... 07020363

(51) Int. Cl.
*H01L 51/00* (2006.01)
*C09D 11/52* (2014.01)
(Continued)

(52) U.S. Cl.
CPC .......... *H01L 51/0003* (2013.01); *B82Y 10/00* (2013.01); *C09D 11/52* (2013.01);
(Continued)

(58) Field of Classification Search
CPC ...................................................... H01B 1/122
(Continued)

(56) References Cited

U.S. PATENT DOCUMENTS 5,682,043 A * 10/1997 Pei et al. ......................... 257/40
5,888,673 A * 3/1999 Kawasato et al. ............ 429/329
(Continued)

FOREIGN PATENT DOCUMENTS

EP 0822236 A1 2/1998
JP 2005530351 10/2005
(Continued)

OTHER PUBLICATIONS

Coakley, K. M., et al. "Conjugated Polymer Photovoltaic Cells." (Chem. Mater.), vol. 16, p. 4533-4542, 2004.
(Continued)

*Primary Examiner* — William Young
(74) *Attorney, Agent, or Firm* — Millen White Zelano and Branigan, PC; John Sopp; Anthony Zelano

(57) ABSTRACT

The invention relates to novel formulations comprising an organic semiconductor (OSC) and a conductive additive, to their use as conducting inks for the preparation of organic electronic (OE) devices, especially organic photovoltaic (OPV) cells, to methods for preparing OE devices using the novel formulations, and to OE devices and OPV cells prepared from such methods and formulations.

13 Claims, 1 Drawing Sheet

(51) Int. Cl.
*B82Y 10/00* (2011.01)
*H01G 11/48* (2013.01)
*H01B 1/12* (2006.01)

(52) U.S. Cl.
CPC ............ *H01G 11/48* (2013.01); *H01B 1/122* (2013.01); *H01L 51/0036* (2013.01); *H01L 51/0046* (2013.01); *Y02E 10/549* (2013.01); *Y02E 60/13* (2013.01)

(58) Field of Classification Search
USPC .......................................... 252/62.3 Q, 500
See application file for complete search history.

(56) References Cited

U.S. PATENT DOCUMENTS

| | | | |
|---|---|---|---|
| 6,099,757 | A | 8/2000 | Kulkarni |
| 7,563,392 | B1* | 7/2009 | Hsu et al. ................. 252/500 |
| 7,569,158 | B2 | 8/2009 | Waller |
| 2003/0151700 | A1* | 8/2003 | Carter et al. ............... 348/801 |
| 2005/0003574 | A1* | 1/2005 | Yang et al. ................. 438/99 |
| 2005/0033014 | A1 | 2/2005 | Zhang |
| 2005/0040390 | A1* | 2/2005 | Pfeiffer et al. .............. 257/40 |
| 2005/0048228 | A1 | 3/2005 | Anderson et al. |
| 2006/0065889 | A1 | 3/2006 | Allemand |
| 2006/0076557 | A1 | 4/2006 | Waller |
| 2006/0175582 | A1 | 8/2006 | Hammond et al. |
| 2007/0281386 | A1* | 12/2007 | Park ........................... 438/99 |

FOREIGN PATENT DOCUMENTS

| | | |
|---|---|---|
| JP | 2005532416 | 10/2005 |
| JP | 2006324649 | 11/2006 |
| JP | 2007200829 | 8/2007 |
| JP | 2007266298 | 10/2007 |
| KR | 10-2006-0052222 | 5/2006 |
| WO | 9405045 A1 | 3/1994 |
| WO | 03/053707 | 7/2003 |
| WO | 03/107453 | 12/2003 |
| WO | 2006/073968 A2 | 7/2006 |
| WO | 2008007896 R | 9/2008 |

OTHER PUBLICATIONS

Waldauf, C., et al. "Highly efficient inverted organic photovoltaics using solution based titanium oxide as electron selective contact." (Applied Physics Letters), vol. 89, p. 233517, 2006.

English Translation of Decision of Rejection in corresponding Japanese Patent Application No. 2010-529254. Date of Notice: Jul. 2, 2014. Date of Dispatch: Jun. 10, 2014.

English Translation of Japanese Publication No. 2006-324649. Publication Date: Nov. 30, 2006. Applicant: Semiconductor Energy Lab Co Ltd., Inventor: Imabayashi Ryota et al. Applicant No. 2006-112834. Filing Date: Apr. 17, 2006.

English Translation of Japanese Publication No. 2007-200829. Publication Date: Aug. 9, 2007. Applicant: Semiconductor Energy Lab Co Ltd., Inventor: Ushikubo Takahiro et al. Applicant No. 2006-077895. Filing Date: Mar. 21, 2006.

English Translation of Japanese Publication No. 2007-266298 Publication Date: Oct. 11, 2007. Applicant: Sanyo Electric Co Ltd., Inventor: Sano Kenji et al. Applicant No. 2007-266298. Filing Date: Mar. 28, 2006.

English Translation of the Korean Notice of Grounds for Rejection in a corresponding Korean Application No. 2010-7010796. Dated: Nov. 26, 2014. (9 pages).

Office Action Issuance Date: Jul. 14, 2016—Notice of Grounds for Rejection—in corresponding Korean Patent Application No. 2010-7010796—Applicant—Merck Patent GmbH & Konarka Technologies GmbH.

* cited by examiner

CONDUCTING FORMULATION

FIELD OF THE INVENTION

The invention relates to novel formulations comprising an organic semiconductor (OSC) and a conductive additive, to their use as conducting inks for the preparation of organic electronic (OE) devices, especially organic photovoltaic (OPV) cells, to methods for preparing OE devices using the novel formulations, and to OE devices and OPV cells prepared from such methods and formulations.

BACKGROUND AND PRIOR ART

When preparing OE devices like organic field-effect transistors (OFETs) or OPV cells, in particular flexible devices, usually printing techniques like inkjet printing, roll to roll printing, slot dye coating or gravure printing are used to apply the OSC layer. Contact printing techniques like gravure printing operate at high speed. However, high speed coating of a plastic substrate with an OSC ink or fluid can lead to a build up of static charge if the fluid is not conducting. This can lead to an electrostatic discharge by arcing, and, if the solvent is flammable, result in a fire or explosion. This hazard can be reduced by engineering solutions such as the use of tinsel and electrostatic neutralization bars. However, the rapid pumping of a non-conductive flammable fluid to a coating or printing head can also lead to electrostatic discharge.

Another possibility to reduce or avoid the building of static charge is to use conducting solvents. The static charge is then harmlessly dissipated to earth via contact with conductive surfaces on the printer. As a result, no static charge accumulates and arcing does not occur. However, this can put serious restraints on the possible choice of solvents for the OSC fluid. For example, the limited solubility of polythiophene-fullerene composites for the OSC fluid for printed bulk heterojunction polymer solar cells requires the use of solvents such as o-xylene [see Waldauf et al., Appl. Phys. Lett. 89, 233517 (2006)]. However, this solvent is virtually non-conductive and will therefore imply the above-mentioned problems due to static charge.

The inventors of the present invention have found that, in order to ensure the safety of printing and coating operations, it is possible to include a conductivity enhancing additive to the semiconductor fluid. The conductivity of the resultant fluid should be on the order from $2 \times 10^{-6}$ to $1 \times 10^{-8}$ Siemens/meter (S/m). The concentration of the additive should be as low as possible. The additive should not adversely affect the performance and lifetime of the devices.

Adding a conductive additive to an OSC material is described in prior art as a measure to increase conductivity of the semiconductor. However, when using a fluid comprising standard OSC materials, like poly(3-hexylthiophene), in an aromatic hydrocarbon solvent, it was so far not possible to achieve the required conductivity without permanently doping the polymer (for example with iodine or other oxidants). For the uses of the present invention, however, permanent doping is undesired as it would lead to a deterioration of the OSC device performance.

For example, US 2006/0175582 discloses a composition for preparing hole injection layers (HIL) or hole transport layers (HTL) for electroluminescent devices. The composition comprises for example a conjugated polymer, like e.g. poly(3-substituted thiophene), a solvent and an oxidant. The oxidant is used to permanently dope the polymer in order to increase its conductivity. Accordingly US 2006/0175582 suggests to use oxidants preferably in high concentrations and selected from highly oxidising additives and/or additives that will remain in the polymer after processing. However, this is exactly the effect that should be avoided by the materials and methods used in the present invention.

EP 0 822 236 A1 discloses a composition comprising a film-forming polymer matrix, an intrinsically conductive polymer dispersed in said matrix, and a material that controls the conductivity in said composition, which is selected from the group consisting of amines, ammonia, organic hydroxyl compounds, epoxides, ethoxylated and propoxylated compounds, acrylates, methacrylates, surfactants with a pH greater that about 7 and mixtures thereof. These materials are used to increase the conductivity of the deposited film or coating of the conductive polymer, and can also be added to the polymer blend after film formation. Again, this is what should be avoided by the materials and methods used in the present invention It is therefore desirable to have fluids comprising an OSC that are suitable for the preparation of OE devices, especially OPV cells, which allow a broader selection of possible solvents, do not lead to problems of static charge as mentioned above, and will not lead to permanent doping of the OSC or otherwise adversely affect the performance and lifetime of the device. One aim of the present invention is to provide such improved fluids. Another aim is to provide improved methods of preparing an OE device from such fluids. Another aim is to provide improved OE devices obtained from such fluids and methods. Further aims are immediately evident to the person skilled in the art from the following description.

The inventors of the present invention have found these aims can be achieved, and the above-mentioned problems can be solved, by providing methods, materials and devices as claimed in the present invention, especially by providing a process for preparing an OE device using a low conducting ink based on a non-conducting solvent. In particular, the inventors of the present invention have found that it is possible to provide an ink with a low conductivity, which is sufficiently high to avoid the building of static charge in the printing process used for depositing the OSC onto the OE device, but is also sufficiently low to avoid a significant negative influence on the OE device performance. This is achieved by providing an ink comprising an OSC material and a non-conducting organic solvent, preferably an aromatic solvent, and further comprising a small amount of one or more conductivity enhancing agents, i.e. additives that increase the conductivity of the formulation (hereinafter also shortly referred to as "conductive additives"). The conductive additive used is either volatile, so that it is evaporated together with the solvent after deposition of the OSC layer on the device, and is thus not remaining in the OSC layer. Alternatively the conductive additive used does not have an oxidising effect on the OSC material. As a result, permanent electrical doping of the OSC material, which could render the OSC too conductive and thereby adversely affect the desired OE device properties, is avoided.

SUMMARY OF THE INVENTION

The invention relates to a formulation comprising one or more organic semiconducting (OSC) compounds, one or more organic solvents, and one or more additives that increase the conductivity of the formulation (conductive additives), wherein said conductive additives are volatile and/or are not capable of chemically reacting with the OSC compounds and/or are present in a total concentration of less than 0.5% by weight.

The invention further relates to the use of a formulation as described above and below as coating or printing ink, especially for the preparation of OE devices, in particular for flexible organic photovoltaic (OPV) cells and devices.

The invention further relates to a process of preparing an organic electronic (OE) device, comprising the steps of
a) depositing a formulation as described above and below onto a substrate, preferably to form a film or layer,
b) removing the solvent(s) and any conductive additives that are volatile or capable of chemically reacting with the OSC compounds, for example by evaporation.

The invention further relates to an OE device prepared from a formulation and/or by a process as described above and below.

The OE devices include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laser diodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

DETAILED DESCRIPTION OF THE INVENTION

Figure 1:
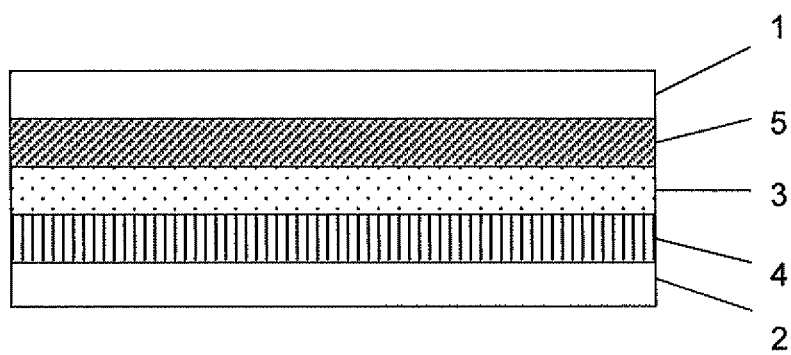
FIG. 1 depicts an OPV device according to a first preferred embodiment of the present invention.

In order to avoid permanent doping of the OSC material, which consists of one or more OSC compounds, the conductive additives are selected from the group consisting of compounds that are volatile and/or are not capable of chemically reacting with the OSC compounds. In particular they are selected from compounds that do not have a permanent doping effect on the OSC material (e.g. by oxidising or otherwise chemically reacting with the OSC material), or from volatile compounds, or both. Therefore, the formulation preferably should not contain additives, like e.g. oxidants or protonic or lewis acids, which react with the OSC material by forming ionic products. Also, the formulation preferably should not contain additives which are not volatile and cannot be removed from the solid OSC material after processing. In case additives are used which may electrically dope the OSC material, like carboxylic acids, they should preferably be selected from volatile compounds so that they can be removed from the OSC film after its deposition.

It can also be tolerable to add conductive additives like for example oxidants, lewis acids, protic inorganic acids or non-volatile protic carboxylic acids, to the formulation. However, the total concentration of these additives in the formulation should then preferably be less than 0.5%, more preferably less than 0.1%, most preferably less than 0.01% by weight.

Preferably, however, the formulation does not contain dopants selected from this group.

Thus, preferably the conductive additives are selected such that they do not permanently dope the OSC, and/or they are removed from the OSC material after processing (wherein processing means for example depositing the OSC material on a substrate or forming a layer or film thereof), and/or they are present in a concentration low enough to avoid a significant effect on the OSC properties, caused for example by permanent doping. Further preferably the conductive additives are not chemically bound to the OSC material or the film or layer comprising it.

Preferred conductive additives are selected from the group consisting of compounds that do not oxidise the OSC material or otherwise chemically react with the OSC material. The terms "oxidise" and "chemically react" as used above and below refer to a possible oxidation or other chemical reaction of the conductive additive with the OSC material under the conditions used for manufacture, storage, transport and/or use of the formulation and the OE device.

Further preferred conductive additives are selected from the group consisting of volatile compounds. The term "volatile" as used above and below means that the additive can be removed from the OSC material by evaporation, after the OSC material has been deposited onto a substrate or an OE device, under conditions (like temperature and/or reduced pressure) that do not significantly damage the OSC material or the OE device. Preferably this means that the additive has a boiling point or sublimation temperature of <300° C., more preferably ≤135° C., most preferably ≤120° C., at the pressure employed, very preferably at atmospheric pressure (1013 hPa). Evaporation can also be accelerated e.g. by applying heat and/or reduced pressure.

Suitable and preferred conductive additives that do not oxidise or otherwise chemically react with the OSC material are selected from the group consisting of soluble organic salts, like for example permanent quaternary ammonium or phosphonium salts, imidazolium or other heterocyclic salts, wherein the anion is for example selected from the group consisting of halides, sulfates, acetate, formate, tetrafluoroborate, hexafluorophosphate, methanesulfonate, triflate (trifluoromethanesulfonate), bis(trifluoromethylsulfonyl)imide or others, and the cation is for example selected from the group consisting of tetraalkyl ammonium, tetraaryl ammonium or mixed tetra alkyl-aryl ammonium ions, wherein the alkyl or aryl groups may be identical or different from each other, furthermore heterocyclic ammonium salts (e.g. ionic liquids), protonated alkyl or aryl ammonium salts or other nitrogen based salts such as dilauryl ammonium salts. Further preferred conductive additives are selected from the group consisting of alkali metal salts such as alkali metal bis(trifluoromethylsulfonyl)imide salts, or inorganic salts.

Very preferred organic salts are for example tetra-n-butyl ammonium chloride, tetraoctyl ammonium bromide, benzyl tridecylammonium benzene sulfate, diphenyl didodecyl ammonium hexafluorophosphate, N-Methyl-N-trioctyl-ammonium bis(trifluoromethylsulfonyl)imide, or mixtures thereof.

Further preferred are volatile organic salts. Suitable and preferred volatile organic salts are e.g. ammonium acetates, formiates, triflates or methanesulfonates, such as trimethylammonium acetate, triethylammonium acetate, dihexylammonium methanesulfonate, octylammonium formate, DBN (1,5-diazabicyclo[4.3.0]non-5-ene) acetate or mixtures or precursors thereof. A preferred additive of this type is e.g. a mixture of tributylamine and trifluoroacetic acid, which produces tributylammonium trifluoroacetate in the formulation, or a mixture of a shortchain trialkyl amine (preferably with a boiling point ≤200° C., very preferably ≤135° C.) and a volatile organic acid (preferably with a boiling point ≤200° C., very preferably ≤135° C., and a pKa value that is equal to or higher than the pKa value of acetic acid).

Further preferred conductive additives are alcohols, preferably volatile alcohols, volatile carboxylic acids, and organic amities, preferably volatile organic amines, very preferably alkyl amines.

Suitable and preferred alcohols or volatile alcohols are for example isopropyl alcohol, iso-butanol (2-butanol), hexanol, methanol or ethanol.

Suitable and preferred volatile carboxylic acids are for example those having a boiling point of ≤135° C., very preferably ≤120° C. at atmospheric pressure), like for example formic acid, acetic acid, di- or trifluoroacetic acid. Other carboxylic acids, like propionic or higher acids, di- or trichloroacetic acid or methanesulfonic acid, are also tolerable and can be used if their concentration is chosen low enough to avoid significant doping of the OSC material, and is preferably from more than 0 to less than 0.5%, preferably less than 0.25%, most preferably less than 0.1% by weight.

Suitable and preferred organic amines or volatile organic amines are alkyl amines, for example primary or secondary alkyl amines, such as n-dibutylamine, ethanolamine or octylamine.

In case of conductive additives that are not removed from the OSC material after deposition of the OSC layer, like e.g. soluble organic salts or non-volatile alcohols or amines as mentioned above, some of these compounds can also have a permanent doping effect even if they do not oxidise or otherwise react with the OSC layer, e.g. by trapping charges flowing through the device. Therefore, the concentration of these additives should be kept low enough so that the device performance is not substantially negatively affected. The maximum tolerable concentration for each of these additives in the formulation can be chosen depending on its capability of permanently doping the OSC material.

In case of conductive additives selected from soluble organic salts, their concentration in the formulation is preferably from 1 ppm to 2 wt. %, more preferably from 50 ppm to 0.6 wt. %, most preferably from 50 ppm to 0.1 wt. %.

In case of conductive additives selected from volatile organic salts, their concentration in the formulation is preferably from 1 ppm to 2 wt. %, more preferably from 50 ppm to 0.6 wt. %, most preferably from 50 ppm to 0.1 wt. %.

In case of conductive additives selected from alcohols or volatile alcohols, their concentration in the formulation is preferably from 1 to 20%, very preferably from 2 to 20%, most preferably from 5 to 10% by weight.

In case of conductive additives selected from volatile carboxylic acids, their concentration in the formulation is preferably 0.001% or more, very preferably 0.01% or more, and preferably 2% or less, very preferably 1% or less, most preferably less than 0.5% (all percentages by weight).

In case of conductive additives selected from amines or volatile amines, their concentration in the formulation is preferably 0.001% or more, very preferably 0.01% or more, and preferably 2% or less, very preferably 1% or less, most preferably less than 0.5% (all percentages by weight).

Conductive additives like iodine and iodine compounds can also be used, like e.g. IBr, iodine in the +3 oxidation state, or other mild oxidants, that can be removed from the solid OSC film e.g. by heating and/or vacuum at the drying stage, so that they do not dope the solid OSC film. However, these additives are preferably used in a concentration from more than 0 to less than 0.5%, preferably less than 0.1%, most preferably less than 0.05% by weight.

Preferably the formulation comprises one to five conductive additives, very preferably one, two or three conductive additives, most preferably one conductive additive.

The conductivity of the formulation of the present invention is preferably from $10^{-4}$ to $10^{-10}$ S/m, very preferably from $10^{-5}$ to $10^{-9}$ S/m, more preferably from $2\times10^{-6}$ to $10^{-9}$ S/m, most preferably from $10^{-7}$ to $10^{-8}$ S/m.

Unless stated otherwise, the conductivity is determined using a parameter analyzer. The sample to be tested is put in a cell of known dimensions. A cell constant is determined from these dimensions. The analyzer is then used to record the current passed as the voltage is scanned from −1V to 1V or 0V to 2V depending on requirements. The recorded data for a standard solution is ohmic. In this case the resistance can be learned by taking the gradient of this ohmic line. Dividing this resistance by the cell constant gives the resistivity, the inverse of which is the conductivity.

The solvents are preferably selected from the group consisting of aromatic hydrocarbons, like toluene, o-, m- or p-xylene, trimethyl benzene, tetralin, anisole, alkyl anisole (e.g. isomers of methyl and dimethyl anisole), naphthalene and alkyl naphthalene.

In case a volatile additive is used, the solvent should be selected such that it can be evaporated from the coated or printed OSC layer together with the additive, preferably in the same processing step. The processing temperature used for removing the solvent and the volatile additive should be selected such that the OSC layer is not damaged. Preferably the deposition processing temperature is from RT to 135° C. and more preferably from RT to 80° C.

It has been observed that some solvents, like for example o-xylene, are poor solvents for many ionizable compounds that are used conductive additive. However, a conductive additive that precipitates from the solution over time can cause problems during coating or printing and is a potential for shorts in the OPV cell. Therefore, in a preferred embodiment of the present invention the formulation comprises a first solvent having a good dissolving power for the OSC compounds, and a second solvent being miscible with the first solvent and having a good dissolving power for the conductive additive (hereinafter also referred to as "carrier solvent"). The first solvent is preferably non-conductive or has low conductivity, and the carrier solvent preferably has a higher conductivity than the first solvent.

Preferably a carrier solvent is used that has a log P of less than 0.6, wherein "log P" is the partition coefficient and is defined as log [concentration of material in n-octanol]/[concentration of material in water]. Unless stated otherwise, log P is measured by measuring the concentrations in each phase (e.g. by GC, HPLC, UV/vis etc.) after equilibrating a dilute solution in equal volumes of water and octanol. Alternatively log P can be measured by molecular calculation.

Suitable and preferred carrier solvents which are miscible with the non-conductive first solvent and possess good dissolving power for the conductive additives include relatively polar solvents selected from the classes of ketones, esters, nitro compounds, nitriles, amides, ureas, ethers, polyethers, alcohols and polyols, acids, sulphoxides and the like, for example cyclopentanone, acetonitrile, benzonitrile, nitromethane, tetrahydrofuran and acetone.

The proportion of the carrier solvent is preferably from 5 to 25 vol. % of the total volume of the formulation.

The OSC compounds can be selected from standard materials known to the skilled person and described in the literature.

The OSC compound may be any conjugated aromatic molecule containing at least three aromatic rings. The OSC compounds preferably contain 5, 6 or 7 membered aromatic rings, and more preferably contain 5 or 6 membered aromatic rings. The material may be a monomer, oligomer or polymer, including mixtures, dispersions and blends.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N($R^3$)($R^4$), where $R^3$ and $R^4$ each independently is H, optionally substituted alkyl, optionally substituted aryl, alkoxy or polyalkoxy groups. Where $R^3$ and $R^4$ is alkyl or aryl these may be optionally fluorinated.

The rings may be optionally fused or may be linked with a conjugated linking group such as —C($T_1$)=C($T_2$)-, —C≡C— —N(R')—, —N=N—, (R')=N—, —N=C (R')—. $T_1$ and $T_2$ each independently represent H, Cl, F, —C≡N— or a lower alkyl group, preferably a $C_{1-4}$ alkyl group; R' represents H, optionally substituted alkyl or optionally substituted aryl. Where R' is alkyl or aryl these may be optionally fluorinated.

Preferred OSC materials include compounds, polymers, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, or soluble substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly (3,4-bisubstituted thiophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes or derivatives thereof; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonapto-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Preferred compounds are those from the above list and derivatives thereof which are soluble.

Especially preferred OSC materials are substituted polyacenes, such as 6,13-bis(trialkylsilylethynyl)pentacene or derivatives thereof, as described for example in U.S. Pat. No. 6,690,029 or WO 2005/055248 A1. A further preferred OSC material is poly(3-substituted thiophene), very preferably poly(3-alkylthiophenes) (P3AT) wherein the alkyl group is preferably straight-chain and preferably has 1 to 12, most preferably 4 to 10 C-atoms, like e.g. poly(3-hexylthiophene).

Optionally, the OSC layer comprises one or more organic binders, preferably polymeric binders, as described for example in WO 2005/055248 A1, to adjust the rheological properties, preferably in a proportion of binder to OSC material from 20:1 to 1:20, preferably 10:1 to 1:10, more preferably 5:1 to 1:5 by weight.

The total concentration of the OSC compounds in the formulation is preferably from 0.1 to 10%, more preferably from 0.5 to 5% by weight.

The formulation preferably comprises or contains, more preferably consists essentially of, very preferably exclusively of, a p type semiconductor and an n type semiconductor, or an acceptor and a donor material. A preferred material of this type is a blend or mixture of poly(3-substituted thiophene) or P3AT with a $C_{60}$ or $C_{70}$ fullerene or modified $C_{60}$ molecule like PCBM [(6,6)-phenyl C61-butyric acid methyl ester], as disclosed for example in WO 94/05045 A1, wherein preferably the ratio of P3AT to fullerene is from 2:1 to 1:2 by weight, more preferably from 1.2:1 to 1:1.2 by weight.

The formulation according to the present invention may additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the OSC or have an electrically doping effect on the OSC.

During the process of preparing an OE device, the OSC layer is deposited onto a substrate, followed by removal of the solvent together with any volatile conductive additives present, to form a film or layer.

The substrate can be any substrate suitable for the preparation of OE devices, or can also be the OE device, or a part thereof. Suitable and preferred substrates are e.g. flexible films of polyethylene terephthalate (PET), polyethylene naphthalate (PEN), polyimide, or planarised Si glass.

Deposition of the OSC layer can be achieved by standard methods that are known to the skilled person and are described in the literature. Suitable and preferred deposition methods include liquid coating and printing techniques. Very preferred deposition methods include, without limitation, dip coating, spin coating, ink jet printing, letter-press printing, screen printing, gravure printing, doctor blade coating, roller printing, reverse-roller printing, offset lithography printing, flexographic printing, web printing, spray coating, brush coating, slot dye coating or pad printing. Gravure printing is especially preferred.

Removal of the solvent and any volatile conductive additives is preferably achieved by evaporation, for example by exposing the deposited layer to high temperature and/or reduced pressure, preferably at 50 to 135° C.

The thickness of the OSC layer is preferably from 10 nm to 50 micron, more preferably from 50 nm to 1 micron.

Further to the materials and methods as described above and below, the OE device and its components can be prepared from standard materials and standard methods, which are known to the person skilled in the art and described in the literature.

Figure 2:
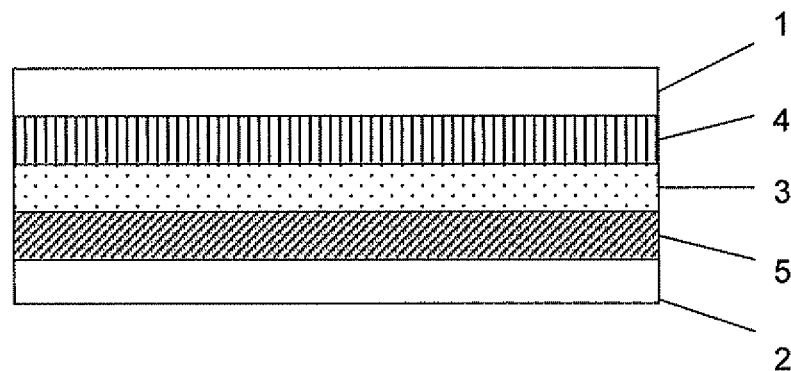
FIG. 2 depicts an OPV device according to a second preferred embodiment of the present invention.

FIG. 1 and FIG. 2 exemplarily and schematically depict typical and preferred OPV devices according to the present invention (see also Waldauf et al., Appl. Phys. Lett. 89, 233517 (2006)).

An OPV device as shown in FIG. 1 preferably comprises:
a low work function electrode (1) (for example a metal, such as aluminum), and a high work function electrode (2) (for example indium-tin-oxide (ITO)), one of which is transparent,
a layer (3) (also referred to as "active layer") comprising a hole transporting material and an electron transporting material, preferably selected from OSC materials, situated between the electrodes (1,2); the active layer can exist for example as a bilayer or two distinct layers or blend or mixture of p and n type semiconductor,
an optional conducting polymer layer (4), for example comprising a blend of PEDOT:PSS (poly(3,4-ethylenedioxythiophene): poly(styrenesulfonate)), situated between the active layer (3) and the high work function electrode (2), to modify the work function of the high work function electrode to provide an ohmic contact for holes,
an optional coating (5) (for example of LiF) on the side of the low workfunction electrode (1) facing the active layer (3), to provide an ohmic contact for electrons.

An inverted OPV device as shown in FIG. 2 preferably comprises:
a low work function electrode (1) (for example a metal, such as gold), and a high work function electrode (2) (for example ITO), one of which is transparent,
a layer (3) (also referred to as "active layer") comprising a hole transporting material and an electron transporting material, preferably selected from OSC materials, situated between the electrodes (1,2); the active layer can exist for example as a bilayer or two distinct layers or blend or mixture of p and n type semiconductor,
an optional conducting polymer layer (4), for example comprising a blend of PEDOT:PSS, situated between the active layer (3) and the low work function electrode (1) to provide an ohmic contact for electrons,
an optional coating (5) (for example of $TiO_x$) on the side of the high workfunction electrode (2) facing the active layer (3), to provide an ohmic contact for holes.

The hole transporting polymer is for example a polythiophene. The electron transporting material is for example an inorganic material such as zinc oxide or cadmium selenide, or an organic material such as a fullerene derivative (like for example PCBM) or a polymer (see for example Coakley, K. M. and McGehee, M. D. *Chem. Mater.* 2004, 16, 4533). If the bilayer is a blend an optional annealing step may be necessary to optimize device performance.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include dendrimers, which are typically branched macromolecular compounds consisting of a multifunctional core group onto which further branched monomers are added in a regular way giving a tree-like structure, as described for example in M. Fischer and F. Vögtle, *Angew. Chem., Int* Ed. 1999, 38, 885.

The term "conjugated polymer" means a polymer containing in its backbone (or main chain) mainly C atoms with $sp^2$-hybridisation, or optionally sp-hybridisation, which may also be replaced by hetero atoms, enabling interaction of one π-orbital with another across an intervening σ-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with $sp^2$-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n=M_n/M_U$, wherein $M_U$ is the molecular weight of the single repeating unit.

The term "small molecule" means a monomeric, i.e. a non-polymeric compound.

Unless stated otherwise, percentages of solids are percent by weight ("wt. %"), percentages or ratios of liquids (like e.g. in solvent mixtures) are percent by volume ("vol. %"), and all temperatures are given in degrees Celsius (° C.).

Unless stated otherwise, concentrations or proportions of mixture components, like the conductive additives, given in percentages or ppm are related to the entire formulation including the solvents.

The partition ratio log P (in the literature also referred to as "partition coefficient") of a compound or material is given by equation (1)

$$\log P = \log([A]_{oct}/[A]_{aq}) \quad (1)$$

wherein $[A]_{oct}$ is the concentration of the compound or material in octanol and $[A]_{aq}$ is the concentration of the compound or material in water.

(See IUPAC Compendium of Chemical Terminology, Electronic version, PAC 1993, 65, 2385, and C. Hansch, Acc. Chem. Res. 2, 232, (1969)).

In case of a solvent blend, which comprises two or more solvents, the partition ratio of the blend is defined as the weighted average (log P)$_w$ of the partition ratios of all solvents contained in the blend, as given by equation (2)

$$(\log P)_w = \sum_{i=1}^{n} w_i \log P_i \quad (2)$$

with n being the number of solvents, log $P_i$ being the log P value of a single solvent in the solvent blend, and $w_i$ being the weight fraction (concentration in % by weight/100) of said solvent in the solvent blend.

The log P values are measured by measuring the concentration in each phase (e.g. by GC, HPLC, UV/vis etc.) after equilibrating a dilute solution in equal volumes of water and octanol, or alternatively log P is calculated by molecular calculation using "Chem Bio Draw Ultra version 11.0 (2007)" software, produced and marketed by Cambridge Soft., unless stated otherwise.

Unless stated otherwise, the conductivity of the solution is measured by placing each solution into a cylindrical vial. A conductivity probe consisting of parallel platinized platinum plates with a cell constant of 0.1 cm$^{-1}$ is positioned in the vial so that the plates were completely immersed. A DC voltage is applied to the cell using an Agilent E3611A DC Power Supply, and the current is measured with a Keithley Picoammeter, model 6485. A range of voltages (typically 0.1 to 2 volts) are applied to check for the linearity of the current response. The resistance of the solution is calculated from the current using Ohm's law. The resistance and the cell constant are used to determine the conductivity of the solution.

The following abbreviations are used:
$V_{oc}$ open-circuit voltage [V]
$I_{sc}$ short circuit current [A]
$J_{sc}$ short circuit current density [mA/cm$^2$]
η energy conversion efficiency [%]
$P_m$ maximum power point [W]
E irradiation [W/m$^2$]
$A_c$ solar cell surface area [m$^2$]
FF electrical fill factor The parameters listed above are determined by scanning the current-voltage curve of the illuminated device. Unless stated otherwise, the illumination source is an Oriel (Newport Physics) Class B Solar Simulator set at 1Sun, AM1.5G (Air Mass 1.5 Global) Devices biased at $V_{oc}$.

The energy conversion efficiency η is given as the percentage of power converted (from absorbed light to electrical energy) and collected, when a solar cell is connected to an electrical circuit. It is given according to equation (1) as the ratio of the maximum power point $P_m$ divided by the product of the input light irradiance E under "standard" test conditions and the surface area $A_C$ of the solar cell:

$$\eta = \frac{P_m}{E \times A_c} \quad (1)$$

The fill factor FF is given according to equation (2) as the ratio of $P_m$ divided by the open circuit voltage $V_{oc}$ and the short circuit current $I_{sc}$:

$$FF = \frac{P_m}{V_{oc} \times I_{sc}} = \frac{\eta \times A_c \times E}{V_{oc} \times I_{sc}} \quad (2)$$

The invention will now be described in more detail by reference to the following examples, which are illustrative only and do not limit the scope of the invention.

Example 1

Various conductive solutions are formulated from poly(3-hexylthiophene) (P3HT) with a molecular weight $M_w$ from 10,000 to 100,000 as OSC compound, an organic solvent and a conductive additive as shown in Table 1 below.

The conductivity is measured by placing each solution into a cylindrical measurement cell. The conductivity cell consists of an inner cylindrical, platinum black coated steel electrode the lower half of which is surrounded by an outer platinum black coated steel electrode. Above this outer electrode and separated by a thin PTFE spacer is a platinum black coated guard ring, with the same diameter as the outer electrode that minimises the effect of fringing fields on the measurement. The electrodes are all spaced with PTFE spacers. To the cell then an alternating current electric field is applied, and a range of frequencies from 2×10$^7$ Hz down to 1 Hz is scanned using a Novacontrol ALHPA A high frequency impedance analyser. The value of the real part of the parallel impedance is measured, which tends to a DC resistance in the low frequency limit. This is then used to calculate the conductivity of the solution. The results are summarized in Table 1.

TABLE 1

| Solvent (for blends in wt. %) | P3HT concentration [wt. %] | Additive and its concentration [wt. %] | Liquid conductivity [S/m] |
|---|---|---|---|
| air | 0 | 0 (control) | 1.19 × 10$^{-12}$ |
| o-xylene | 0 | 0 (control) | 1.55 × 10$^{-9}$ |
| o-xylene | 1.5 | 0 (control) | 1.39 × 10$^{-9}$ |
| o-xylene | 0 | tetraoctylammonium bromide, 0.025 | 2.70 × 10$^{-8}$ |
| o-xylene | 1.5 | tetraoctylammonium bromide, 0.1 | 7.88 × 10$^{-8}$ |
| o-xylene | 1.5 | acetic acid, 1.0 | 5.49 × 10$^{-8}$ |
| o-xylene/1-methyl-naphthalene (1-MN) (85:15) | 1.5 | 0 (control) | 2.85 × 10$^{-10}$ |
| o-xylene/1-MN (85:15) | 1.5 | acetic acid, 1.0 | 4.27 × 10$^{-9}$ |
| o-xylene/1-MN (85:15) | 1.5 | iodine, 0.0001 | 1.10 × 10$^{-8}$ |
| o-xylene | 0 | tributylammonium trifluoroacetate, 1.0 | 4.73 × 10$^{-8}$ |
| o-xylene | 1.5 | tributylammonium trifluoroacetate, 1.0 | 4.12 × 10$^{-8}$ |

TABLE 1-continued

| Solvent (for blends in wt. %) | P3HT concentration [wt. %] | Additive and its concentration [wt. %] | Liquid conductivity [S/m] |
|---|---|---|---|
| o-xylene | 1.5 | tributylammonium trifluoroacetate, 0.1 | $1.38 \times 10^{-9}$ |
| o-xylene | 1.5 | trifluoroacetic acid, 0.25 | $1.27 \times 10^{-6}$ |

The samples (with or without polymer) containing a conductive additive have higher conductivity than the corresponding control samples without conductive additive.

Example 2

N-Methyl-N-trioctyl-ammonium bis(trifluoromethylsulfonyl)imide is dissolved in o-xylene in a concentration of 1779 ppm. The conductivity of the resulting solution is $3.3 \times 10^{-7}$ S/m.

N-Methyl-N-trioctyl-ammonium bis(trifluoromethylsulfonyl)imide is dissolved in a mixture of 10 vol. % cyclopentanone (carrier solvent) and 90 vol. % o-xylene in a concentration of 332 ppm. The conductivity of the resulting solution is $1 \times 10^{-6}$ S/m.

This shows that is possible to reduce the concentration of the conductive additive, and at the same time increase the conductivity of the formulation, by using a carrier solvent.

Example 3

A P3HT/PCBM semiconductor blend (1:0.9 by weight) is dissolved in a mixture of 10 vol. % cyclopentanone and 90 vol. % o-xylene at a concentration of 4.5% by weight. The conductive agent N-Methyl-N-trioctyl-ammonium bis(trifluoromethylsulfonyl)imide is added in a concentration of 647 ppm. The conductivity of the resulting solution is $1.1 \times 10^{-6}$ S/m.

An OPV device comprising this solution (test device) is fabricated as an inverted cell and its current density-voltage (J/V) characteristics are measured as described in Waldauf et al., Appl. Phys. Lett. 89, 233517 (2006). The results are shown in Table 2 below.

For comparison purposes, a control device is prepared and its J/V characteristics are measured as described above, but wherein the solution does not contain a conductive additive.

TABLE 2

| | Efficiency η [%] | $V_{OC}$ [V] | $J_{SC}$ [mA/cm$^2$] | FF [%] |
|---|---|---|---|---|
| Control device (without cond. additive) | 2.6225 | 0.603 | 7.410 | 58.78 |
| Test device (with cond. additive) | 2.3325 | 0.560 | 7.245 | 57.54 |

The efficiency of the test photovoltaic device efficiencies is within the acceptable variance for device performance.

The invention claimed is:

1. A formulation comprising:
   one or more organic semiconducting (OSC) compounds,
   one or more organic solvents, and
   one or more conductive additives that increase the conductivity of the formulation;
   wherein said conductive additives are volatile and/or are not capable of chemically reacting with the OSC compounds and/or wherein the conductive additives are present in a total concentration of less than 0.5% by weight in the formulation; and
   wherein the conductive additives comprise one or more non-oxidizing organic salts and the concentration of non-oxidizing salts in the formulation is from 50 ppm to 0.1% by weight, and
   wherein the non-oxidizing organic salts are selected from the group consisting of phosphonium salts, imidazolium salts and other heterocyclic salts excluding heterocyclic ammonium salts, wherein the non-oxidizing organic salts have an anion that is selected from the group consisting of halides, sulfates, acetate, formate, tetrafluoroborate, hexafluorophosphate, methanesulfonate, triflate (trifluoromethanesulfonate) and bis(trifluoromethylsulfonyl)imide.

2. The formulation according to claim 1, wherein the formulation has a conductivity from $10^{-6}$ to $10^{-9}$ S/m.

3. The formulation according to claim 1, wherein the formulation comprises a first solvent having a good dissolving power for the OSC compounds, and a second carrier solvent being miscible with the first solvent and having a good dissolving power for the conductive additive.

4. The formulation according to claim 3, wherein the first solvent is selected from the group consisting of toluene, o-, m- or p-xylene, trimethyl benzene, tetralin, anisole, alkyl anisoles, naphthalene and alkyl naphthalene.

5. The formulation according to claim 3, wherein the carrier solvent is selected from the group consisting of cyclopentanone, acetonitrile, benzonitrile, nitromethane, tetrahydrofuran and acetone.

6. The formulation according to claim 3, wherein the proportion of the carrier solvent is from 5 to 25 vol. % of the total volume of the formulation.

7. Formulation according to claim 1, wherein the OSC compounds are selected from the group consisting of substituted polyacenes or poly(3-substituted thiophene).

8. The formulation according to claim 1, wherein the formulation comprises a p type OSC compound and an n type OSC compound.

9. The formulation according to claim 1, wherein the formulation comprises a mixture of poly(3-substituted thiophene) with a $C_{60}$ or $C_{70}$ fullerene or (6,6)phenyl $C_{61}$ butyric acid methyl ester.

10. The formulation according to claim 1, wherein the total concentration of the OSC compounds in the formulation is from 0.1% to 10% by weight.

11. A method for coating or printing which comprises applying a formulation according to claim 1 as a coating or printing ink.

12. A process for preparing an organic electronic (OE) device, comprising the steps of
   a) depositing the formulation according to claim 1 onto a substrate to form a film or layer,
   b) removing the solvent(s) and any conductive additives that are volatile or capable of chemically reacting with the OSC material.

13. The method of claim 12, wherein the solvent(s) and any conductive additives that are volatile or capable of chemically reacting with the OSC material are removed by evaporation.

* * * * *